(12) United States Patent
Lin et al.

(10) Patent No.: US 7,405,481 B2
(45) Date of Patent: Jul. 29, 2008

(54) GLUE LAYER FOR ADHESION IMPROVEMENT BETWEEN CONDUCTIVE LINE AND ETCH STOP LAYER IN AN INTEGRATED CIRCUIT CHIP

(75) Inventors: Keng-Chu Lin, Ping-Tung (TW); Yung-Cheng Lu, Taipei (TW); Shwang-Ming Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 56 days.

(21) Appl. No.: 11/004,065

(22) Filed: Dec. 3, 2004

(65) Prior Publication Data

US 2006/0118921 A1 Jun. 8, 2006

(51) Int. Cl.
*H01L 23/48* (2006.01)
*H01L 23/52* (2006.01)

(52) U.S. Cl. ........................ 257/753; 257/751; 257/758; 257/762

(58) Field of Classification Search ......... 257/751–753, 257/758, 759, 761–763, 765–773; 438/626–628, 438/631, 654, 643–645, 685, 687
See application file for complete search history.

(56) References Cited

U.S. PATENT DOCUMENTS 6,914,320 B2 * 7/2005 Chen et al. ................... 257/652

* cited by examiner

*Primary Examiner*—Hung Vu
(74) *Attorney, Agent, or Firm*—Slater & Matsil, L.L.P.

(57) ABSTRACT

In an integrated circuit chip, a conductive line is formed in a first IMD layer. The conductive line is formed of a conductive line material that tends to form an oxide when exposed to an oxygen-containing substance. A glue layer is formed on the conductive line. The glue layer is formed of a non-oxygen-containing material capable of providing an oxygen barrier over the conductive line. The glue layer has a hardness greater than that of the conductive line. The glue layer preferably has a thickness between about 15 angstroms and about 75 angstroms. The etch stop layer is formed on the glue layer. The etch stop layer has a hardness greater than that of the glue layer. A second IMD layer is formed on the etch stop layer. The etch stop layer and/or the second IMD layer may be formed with a material comprising oxygen without oxidizing the conductive line.

23 Claims, 7 Drawing Sheets

GLUE LAYER FOR ADHESION IMPROVEMENT BETWEEN CONDUCTIVE LINE AND ETCH STOP LAYER IN AN INTEGRATED CIRCUIT CHIP

TECHNICAL FIELD

The present invention generally relates to the fabrication of integrated circuit chips having semiconductor devices. In one aspect it relates more particularly to fabricating an intermetal dielectric structure incorporating a glue layer for providing improved adhesion strength in an integrated circuit chip.

BACKGROUND

Integrated circuit (IC) chips are often electrically connected by wires (e.g., gold or aluminum wires) to a leadframe or a substrate in a packaging assembly to provide external signal exchange. Such wires are typically wire bonded to bond pads formed on an IC chip using thermal compression and/or ultrasonic vibration. A wire bonding process exerts thermal and mechanical stresses on a bond pad and on the underlying layers and structure below the bond pad. The bond pad structure needs to be able to sustain these stresses to ensure a good bonding of the wire.

During a wire bonding process and as the wire is pulled (after being bonded to the bond pad), this process also exerts large pulling or tension forces on the bond pad structure. These forces are translated downward into the intermetal dielectric (IMD) layers. If there is a weak point in the structure of the chip below the bond pad or near the bond pad that cannot withstand the pulling forces, peeling or delamination may occur. Recent innovations have strengthened the bond pad structures so that the bond pad structures can reliably endure the forces of wire bonding. However, now it has been found that certain interfaces in the IMD layers are becoming weak links causing peeling failure during wire bonding. In particular, it has been found that the interface between an etch stop layer and a copper line may be have insufficient adhesion strength (i.e., tensile strength), especially when copper oxide is formed on the copper line.

FIG. 1 is a simplified cross-section schematic of a prior art structure 20 showing copper lines 22 located below a bond pad (not shown). In FIG. 1, the two copper lines 22 shown are formed in an intermetal dielectric (IMD) layer 24. Typically, the insulating material of the IMD layer 24 is a low-k dielectric material (e.g., k<3.9). A barrier layer 28 is formed between the copper lines 22 and the surrounding dielectric materials, as is typical. Another IMD layer 30 is formed over the copper lines 22. An etch stop layer 32 is located between the upper IMD 30 and the copper lines 22. The etch stop layer 32 usually will have a stronger adhesion with the copper lines 22 than to a low-k dielectric material of the IMD layer 24.

As shown in FIG. 1, a copper oxide 34 is formed on the top surface of the copper lines 22. As noted above, the presence of the copper oxide 34 at this interface between the etch stop layer 32 and the copper lines 22 lessens the adhesion strength. Thus, it is preferable to remove the copper oxide 34 and/or prevent the formation of the copper oxide at this interface.

But in many current processes, the etch stop layer 32 is formed using an oxygen-containing precursor and/or the etch stop layer itself includes oxygen in its chemical structure (e.g., SiCO, Blok II by Applied Materials). In such cases, copper oxide 34 may develop at the interface between the etch stop layer 32 and the copper lines 22 during the formation of the etch stop layer 32, even if the copper 22 is precleaned prior the etch stop layer formation. Also, low-k dielectric materials for the IMD layer 30 are often formed using an $O_2$ plasma and often these low-k dielectric materials include oxygen in their chemical structure. During the formation of an IMD layer 30 over an etch stop layer 32 and copper lines 22 (see e.g., FIG. 1), the oxygen may penetrate through the etch stop layer 32 and add to the formation of or cause the formation of copper oxide 34 on the copper lines 22. Thus, there is a need for a process and structure that will reduce or prevent the formation of a copper oxide 34 on the copper lines 22.

SUMMARY OF THE INVENTION

The problems and needs outlined above may be addressed by embodiments of the present invention. In accordance with one aspect of the present invention, an integrated circuit chip is provided, which includes a first intermetal dielectric (IMD) layer, a conductive line, a glue layer, an etch stop layer, and a second intermetal dielectric (IMD) layer. The conductive line is formed in the first IMD layer. The glue layer is formed on the conductive line. The glue layer is formed of a non-oxygen-containing material. The glue layer has a hardness greater than that of the conductive line. The etch stop layer is formed on the glue layer. The etch stop layer has a hardness greater than that of the glue layer. The second intermetal dielectric (IMD) layer is formed on the etch stop layer.

In accordance with another aspect of the present invention, an integrated circuit chip is provided, which includes a first intermetal dielectric (IMD) layer, a conductive line, a glue layer, an etch stop layer, and a second intermetal dielectric (IMD) layer. The conductive line is formed in the first IMD layer. The conductive line may be formed of a conductive line material that tends to form an oxide when exposed to an oxygen-containing substance. The glue layer is formed on the conductive line. The glue layer is formed of a non-oxygen-containing material. The glue layer material may be capable of providing an oxygen barrier over the conductive line. The glue layer has a hardness greater than that of the conductive line. The glue layer has a thickness between about 15 angstroms and about 75 angstroms. The glue layer material includes silicon and carbon. The etch stop layer is formed on the glue layer. The etch stop layer has a hardness greater than that of the glue layer. The etch stop layer includes silicon. The second intermetal dielectric (IMD) layer is formed on the etch stop layer. The etch stop layer and/or the second IMD layer is formed with a material comprising oxygen.

In accordance with yet another aspect of the present invention, a method of fabricating an integrated circuit chip is provided. This method includes the following steps described in this paragraph. The order of the steps may vary, may be sequential, may overlap, may be in parallel, and combinations thereof. A conductive line is formed in a first intermetal dielectric (IMD) layer. A glue layer is formed on the conductive line. The glue layer is formed of a non-oxygen-containing material. The glue layer has a hardness greater than that of the conductive line. An etch stop layer is formed on the glue layer. The etch stop layer has a hardness greater than that of the glue layer.

In accordance with still another aspect of the present invention, a method of reducing the formation of an oxide on a conductive line while fabricating an integrated circuit chip is provided. This method includes the following steps described in this paragraph. The order of the steps may vary, may be sequential, may overlap, may be in parallel, and combinations thereof. A conductive line is formed in a first intermetal dielectric (IMD) layer. A glue layer is formed on the conductive line. The glue layer is formed of a non-oxygen-containing material. The glue layer has a hardness greater than that of the conductive line. The glue layer has a thickness between about 15 angstroms and about 75 angstroms. The glue layer material includes silicon and carbon. An etch stop layer is formed on the glue layer. The etch stop layer has a hardness greater than that of the glue layer. A second intermetal dielectric (IMD) layer is formed on the etch stop layer. The etch stop layer and/or the second IMD layer is formed with a material comprising oxygen.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
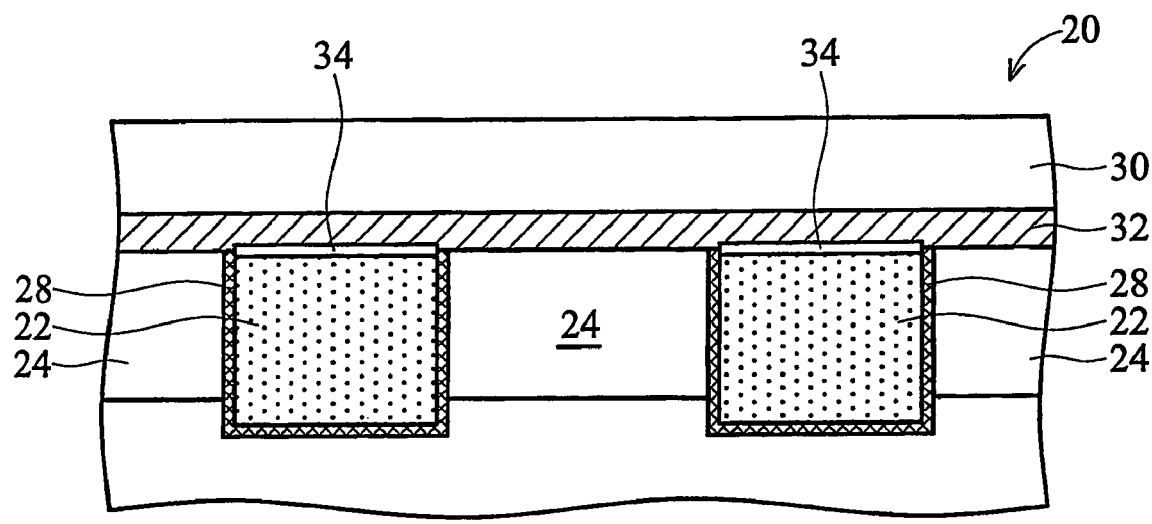
FIG. 1 is a simplified cross-section schematic showing copper lines formed in an IMD layer for a prior art structure.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 2:
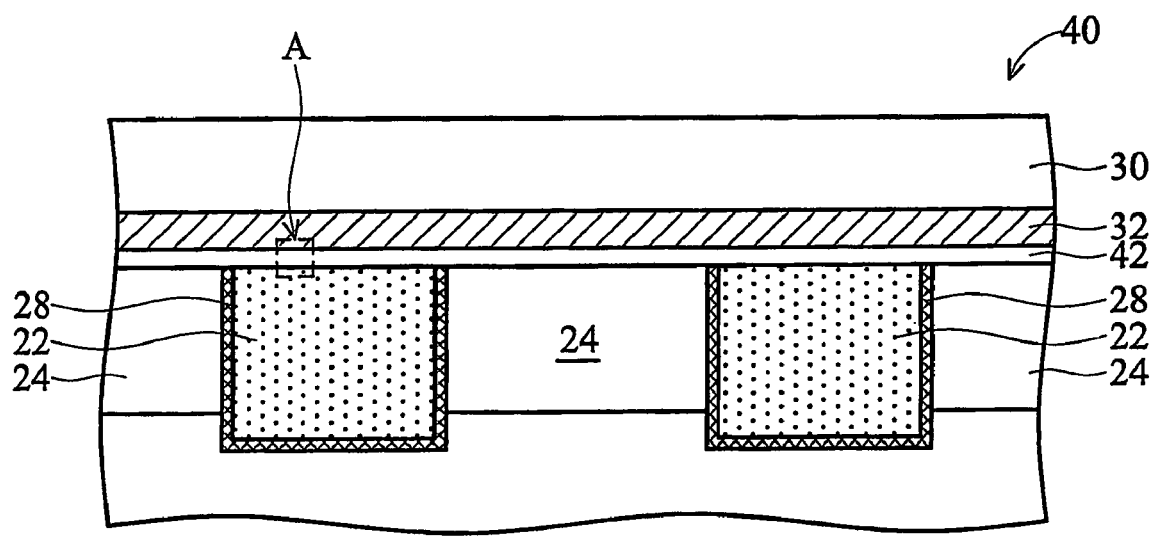
FIG. 2 is a simplified cross-section schematic showing a first illustrative embodiment of the present invention.

Generally, an embodiment of the present invention provides a structure and method of reducing (preferably preventing) the formation of an oxide on conductive lines while fabricating an integrated circuit chip. FIG. 2 illustrates a structure 40 in accordance with a first illustrative embodiment of the present invention. More specifically, FIG. 2 shows a simplified cross-section schematic of conductive lines 22 formed in an intermetal dielectric (IMD) layer 24, which may be located below a bond pad (not shown) for example.

For purposes of comparison and illustration, the structure 40 shown in FIG. 2 is similar to the prior art structure 20 shown in FIG. 1, except that the structure 40 of FIG. 2 lacks the undesirable oxide formation 34 on the conductive lines 22 and adds a glue layer 42. The glue layer 42 is preferably formed directly on the conductive lines 22 and is located between the conductive lines 22 and the etch stop layer 32. This glue layer 42 is added to increase the adhesion strength between the conductive lines 22 and the etch stop layer 32, as will be explained in more detail below.

The conductive lines 22 may be made from any of a wide variety of conductive materials, including but not limited to: copper, aluminum, tungsten, titanium, alloys thereof, compounds thereof, or combinations thereof, for example. An embodiment of the present invention is especially useful for structures where the conductive lines 22 are formed of a conductive line material that tends to form an oxide when exposed to an oxygen-containing substance (e.g., air, oxygen-containing precursor, oxygen-containing etch stop layer, oxygen-containing plasma, oxygen-containing IMD layer material). Copper is currently the preferred material used for the conducting lines 22. Copper is highly susceptible to forming copper oxide when exposed to oxygen.

The etch stop layer 32 is often formed using an oxygen-containing precursor and/or the etch stop layer itself often includes oxygen in its chemical structure (e.g., SiCO, Blok II by Applied Materials). In such cases, as illustrated in FIG. 1, an oxide 34 may develop at the interface between the etch stop layer 32 and the conductive lines 22 during the formation of the etch stop layer 32, even if the conductive lines 22 are precleaned prior the etch stop layer formation. Furthermore, the IMD layers 24, 30 are typically made from low-k dielectric material(s), and may be made from any suitable dielectric material. Many low-k dielectric materials are formed in an oxygen-containing environment (e.g., $O_2$ plasma process) and/or include oxygen in the chemical make-up of the material. The addition of a glue layer 42, e.g. as shown in FIG. 2, between the conductive lines 22 and the etch stop layer 32 may greatly reduce and preferably eliminate the formation of an oxide 34 on the conductive lines 22 during the formation of the etch stop layer 32 and/or during the formation of the upper IMD layer 30.

In a preferred method, the glue layer 42 may be deposited using chemical vapor deposition (CVD) in a CVD chamber (not shown). In a case where the conductive lines 22 are copper, for example, the wafer is often exposed to the air after a copper chemical-mechanical polishing (CMP) procedure for several hours. This leads to the formation of a copper oxide 34 on the conductive lines 22. In a preferred method of forming a structure of an embodiment, the following steps may be used to form the glue layer 42 and the etch stop layer 32, for example. In this example, the conductive lines 22 are copper. After the conductive lines 22 are formed in the IMD layer 24 (e.g., after CMP of copper lines 22), the wafer may be placed in a CVD chamber and may be preheated at a temperature between about 200° C. and about 400° C. for less than about 3 minutes. Next, a pretreatment step is preferably performed to remove the copper oxide formed on the conductive lines 22 (e.g., formed after CMP of copper lines 22). It is preferred to remove all oxide 34 from conductive lines 22 prior to forming the glue layer 42. The copper oxide may be removed using a hydrogen-containing plasma etch. In a hydrogen plasma treatment, the copper oxide forms copper and water by a chemical reaction. The water is removed. The pretreatment may be hydrogen or various combinations of nitrogen and hydrogen (e.g, ammonia, $NH_3$, $N_2+H_2$), for example. Typically, there will be some hydrogen residue on the wafer surface, which may end up as part of the glue layer composition, especially at and near the interface of the glue layer 42 and the conductive lines 22. Next, the glue layer 42 may be deposited using a CVD process. After the glue layer 42 is formed, the etch stop layer 32 may be formed by a CVD process immediately thereafter. In this preferred process just described, the preheat, pretreatement, glue layer deposition, and etch stop layer deposition may be performed in-situ in the same CVD chamber without moving the wafer.

The glue layer 42 provides two advantageous features. The first is preventing the formation of an oxide 34 on the conducting lines 22, as mentioned above (see e.g., FIG. 1). The second is providing favorable chemical bonding and mechanical properties for further improving adhesion between the conducting lines 22 and the etch stop layer 32, as will be described in more detail below.

To meet the first advantageous feature listed above, the glue layer 42 is preferably a non-oxygen-containing material capable of providing an oxygen barrier over the conductive line. At least three preferred criteria of an embodiment contribute to meeting the second advantageous feature listed above.

The first preferred criteria is that the glue layer 42 is formed of a material or materials that provide good chemical bonding between the glue layer 42 and the conducting lines 22, as well as between the glue layer 42 and the etch stop layer 32. The glue layer 42 may be made from any of a variety of suitable non-oxygen containing materials, including a glue layer material that includes silicon and carbon, and a glue layer material that includes silicon and nitrogen, for example.

Figure 3A:
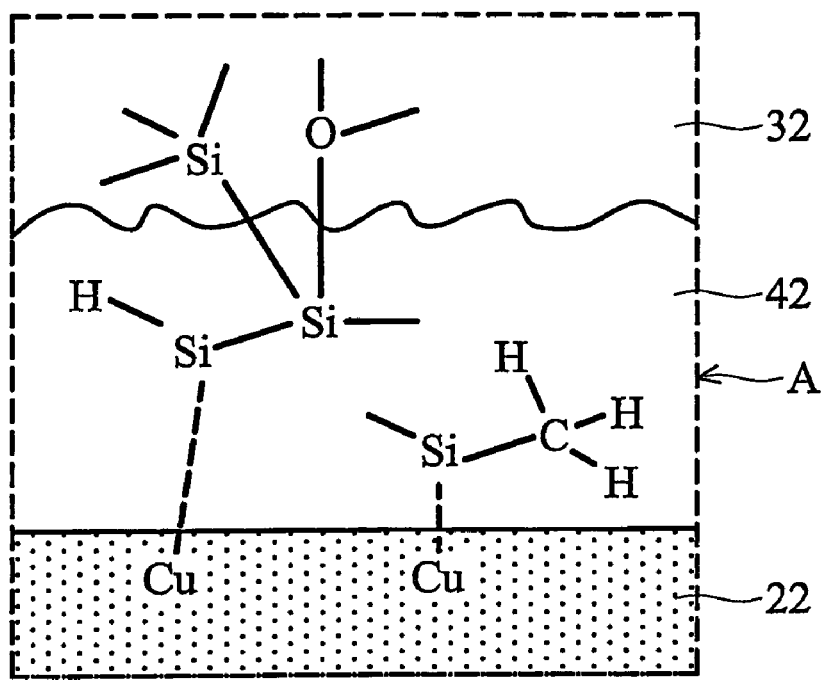
FIGS. 3A and 3B are interface schematics for enlarged portions of FIG. 2 at area A.
Figure 3B:
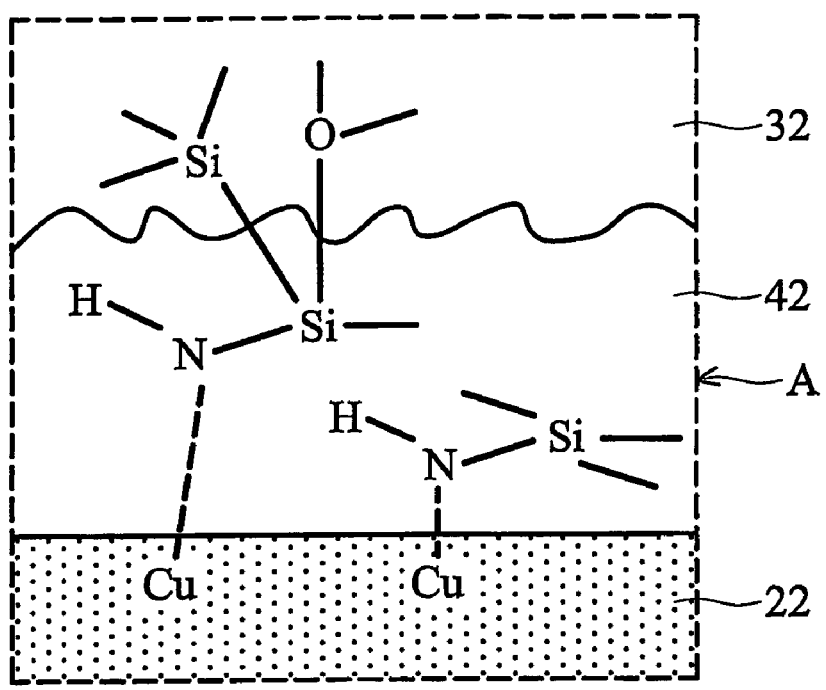

FIGS. 3A and 3B are interface schematics for enlarged portions of FIG. 2 at area A. FIG. 3A illustrates some of the chemical bonds formed when the glue layer 42 includes silicon and carbon, the etch stop layer 32 is SiCO (e.g., Blok II by Applied Materials), and the conducting lines 22 are copper. As illustrated in FIG. 3A, some residual hydrogen may become included in the glue layer material (e.g., less than about 10%). If the pretreatment includes nitrogen as well, there may also be some residual nitrogen that also becomes part of the glue layer material. The glue layer 42 may be a compound that includes silicon and nitrogen, as illustrated in FIG. 3B. Si—Si—Cu bonding and Si—N—Cu bonding may be used to strongly bridge between the etch stop layer 32 and the copper conductive lines 22. The material make-up of the glue layer 42 may vary at different locations in the glue layer 42 (e.g., at glue layer/conductive line interface, at glue layer/etch stop layer interface). The end product of the glue layer 42 will depend, in part, upon the pretreatment chemistry used to clean the conductive lines 22 prior to glue layer deposition.

Figure 4:
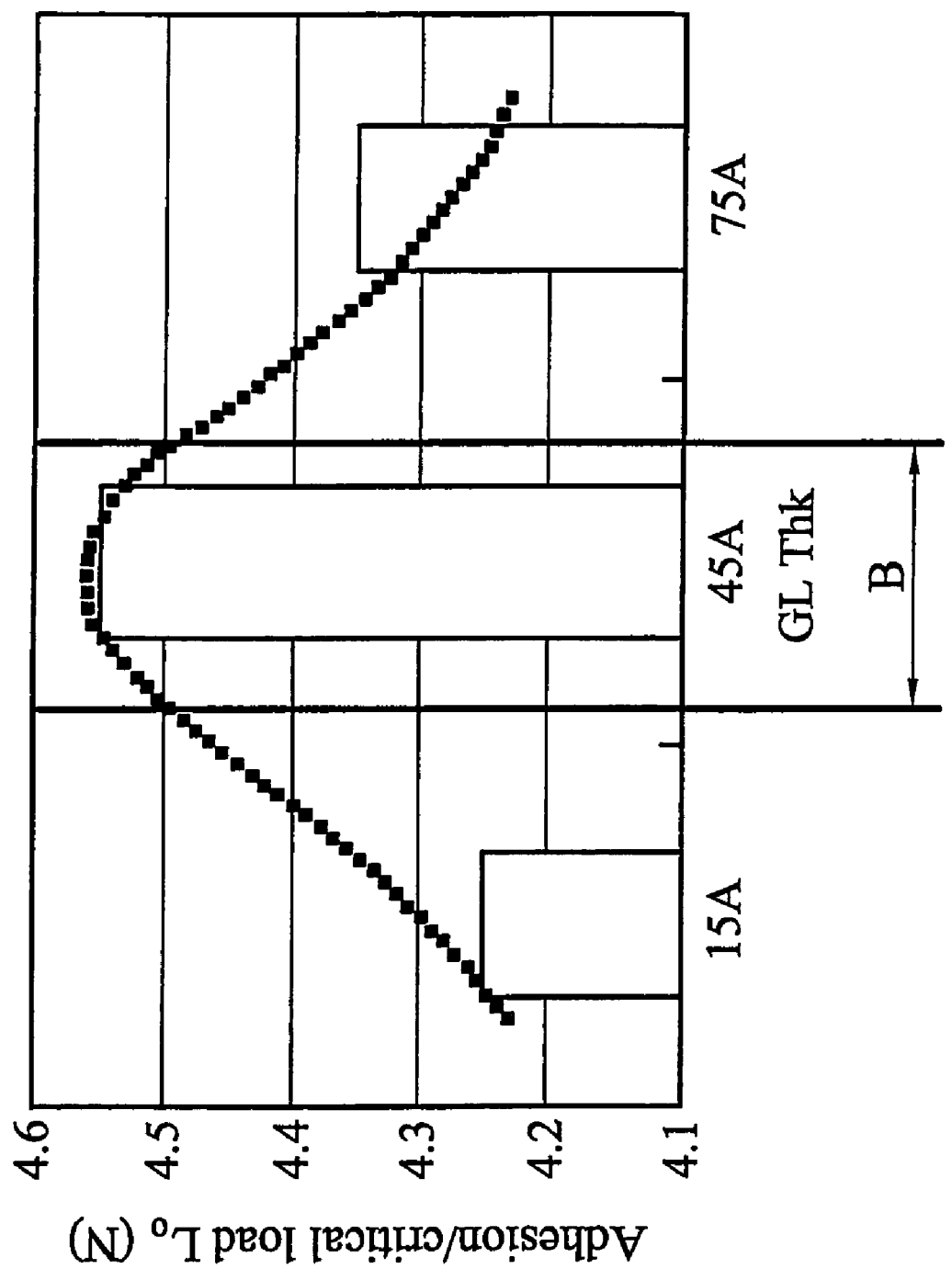
FIG. 4 is a graph illustrating the adhesion strength (critical load $L_c$) as a function of glue layer thickness for a preferred glue layer material in a structure like that of FIG. 2.

The second preferred criteria is that the glue layer 42 preferably has a thickness between about 15 angstroms and about 75 angstroms. FIG. 4 is a graph illustrating the adhesion strength (critical load $L_c$) as a function of glue layer thickness for a preferred glue layer material in a structure 40 like that of FIG. 2. This graph of FIG. 4 was obtained from a microscratching adhesion test using a preferred glue layer material (e.g., preferred glue layer material described below with respect to FIG. 5). Based upon these experimental results, a most preferred thickness for the glue layer 42 of an embodiment may be between about 35 angstroms and about 55 angstroms, as illustrated by portion B in FIG. 4. The preferred thickness of the glue layer 42 for an embodiment will greatly depend on the material choices for the glue layer 42 and the conductive lines 22.

Figure 5:
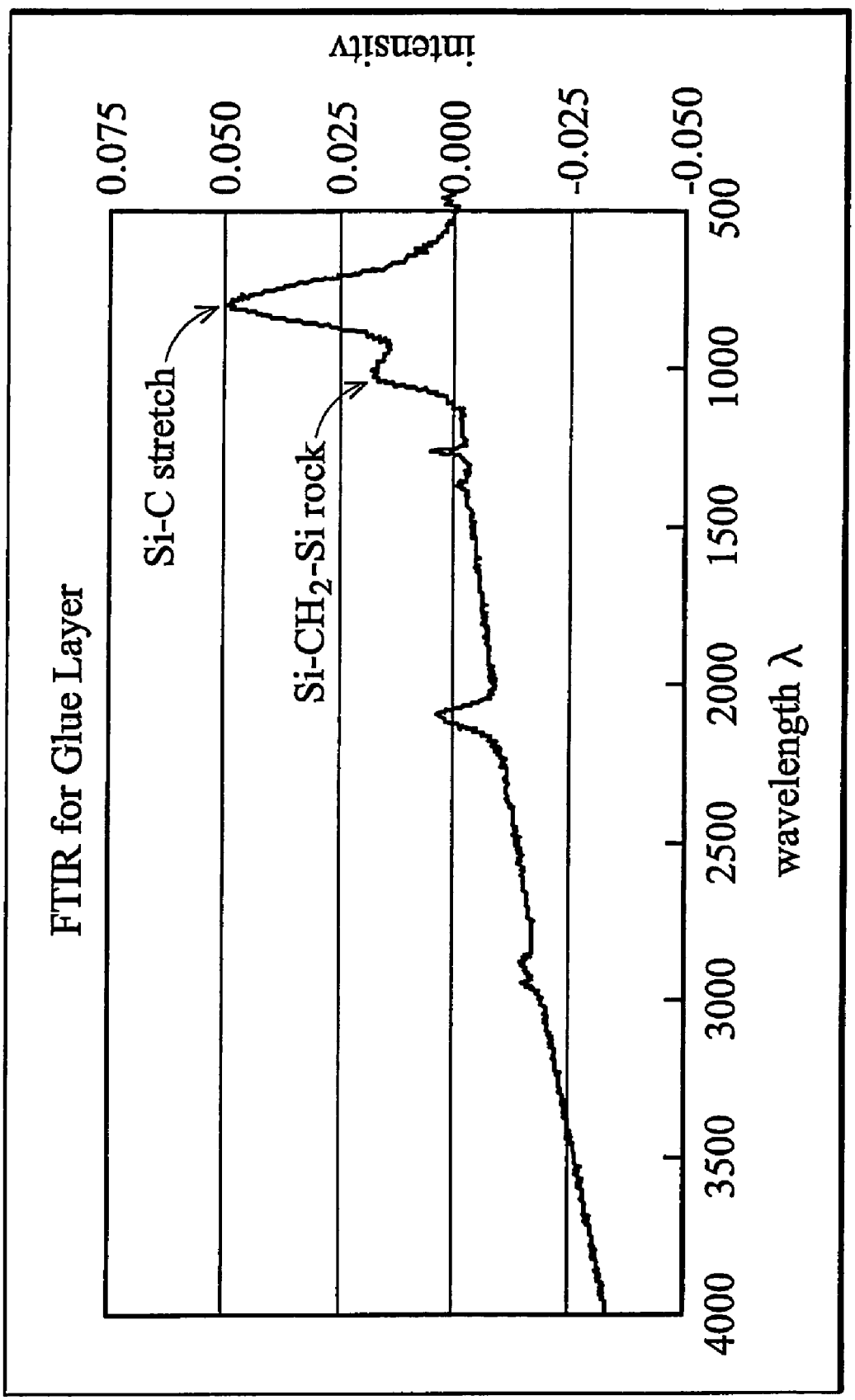
FIG. 5 shows a graph of a Fourier Transform infrared (FTIR) analysis of a preferred glue layer material.

The third preferred criteria is that the glue layer 42 preferably has a hardness greater than that of the conductive lines 22 but less than that of the etch stop layer 32. The currently preferred materials of the etch stop layer 32 typically have a hardness much greater than that of the conductive lines 22. Including a glue layer 42 located therebetween and having a hardness value between that of the etch stop layer 32 and the conductive lines 22 helps to provide a more mechanically favorable structure for improved adhesion strength and for better handling wire bonding stresses and strains exerted on the chip. A preferred glue layer material is a mixture or compound of materials where the ratio of materials may be varied to obtain a preferred hardness value for the glue layer 42. For example, a preferred glue layer material is a mixture of Si—C and Si—CH$_2$—Si so that the ratio of Si—CH$_2$—Si to Si—C is in a range from about 0.3 to about 0.5. FIG. 5 shows a graph of a Fourier Transform infrared (FTIR) analysis of this preferred glue layer. Si—C alone as the glue layer would be unfavorable due to its hardness. But by mixing Si—C with Si—CH$_2$—Si, a more preferred hardness and modulus may be obtained.

Figure 6:
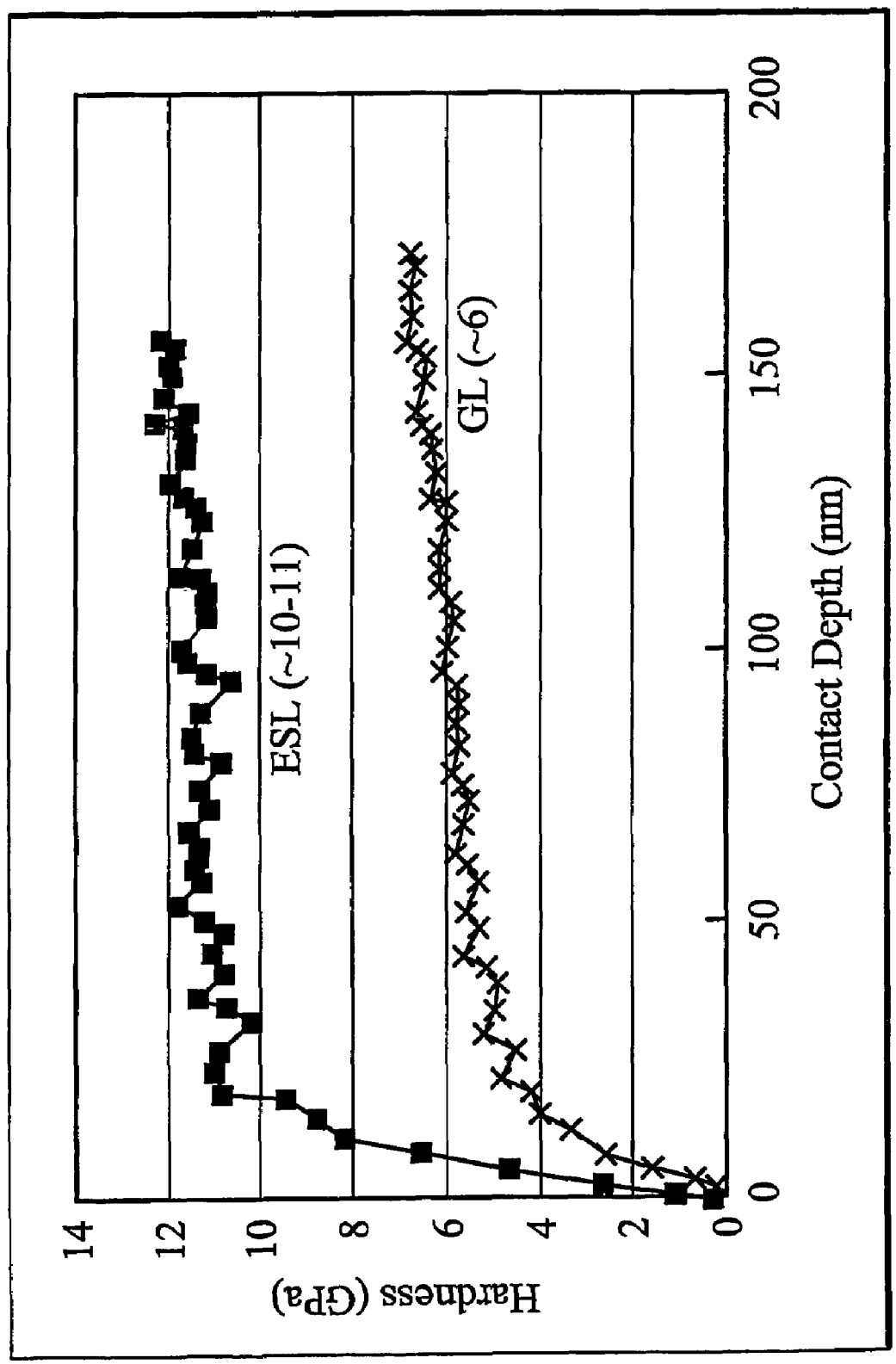
FIGS. 6 and 7 are graphs comparing the hardness and modulus of elasticity of the preferred glue layer of FIG. 5 and an etch stop layer made of SiCO.
Figure 7:
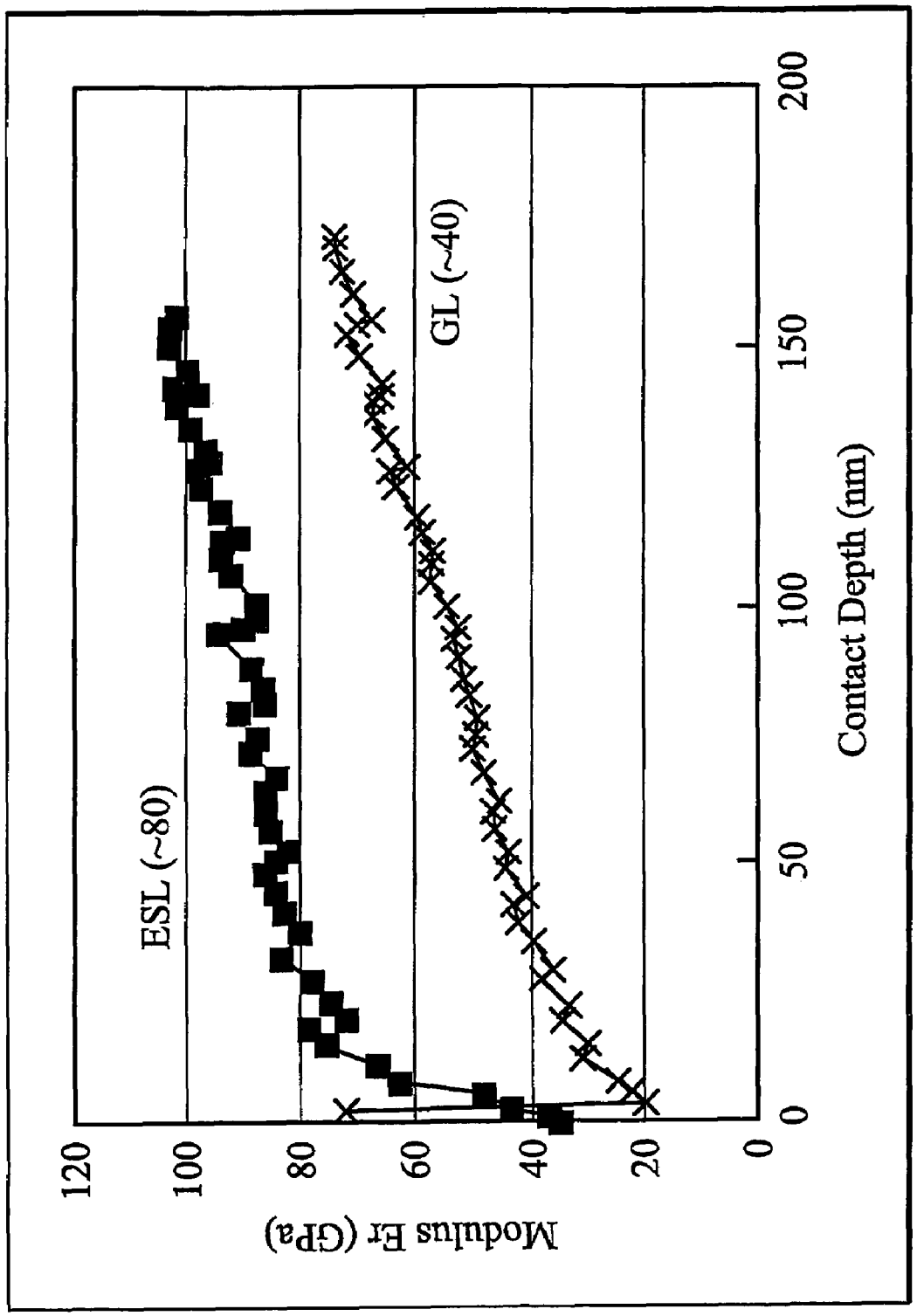

FIGS. 6 and 7 are graphs comparing the hardness and modulus of elasticity (Young's modulus) of the preferred glue layer 42 of FIG. 5 and an etch stop layer 32 made of SiCO. Referring to FIG. 6, the etch stop layer 32 has a hardness that is about 10-11 GPa and the preferred glue layer 42 has a hardness that is about 6 GPa, on average. As a comparison, copper generally has a hardness of about 1.9 GPa. Referring to FIG. 7, the modulus for the etch stop layer 32 is about 80 GPa and the modulus for the glue layer 42 is about 40 GPa, on average, where the modulus of copper is about 100 GPa. Although the glue layer 42 is weaker than the etch stop layer 32, the lower hardness and lower modulus of the glue layer 42 makes the glue layer 42 more ductile (i.e., less brittle) and able to better absorb some of the motion and displacement during a wire bonding process. This gradient between the conductive lines 22 and the etch stop layer 32 (provided by the intermediate glue layer 42) helps reduce stress risers at this interface and provides a good transition between the relatively soft copper 22 and the relatively hard etch stop layer 32 (e.g., SiCO). If the glue layer 42 is too hard, the overall structure 40 will not be able to handle wire bonding stresses and strains as well. A preferred hardness for the glue layer 42 is less than about ¾ of the etch stop layer hardness, for example. And, a preferred modulus for the glue layer 42 is less than about ¾ of the etch stop layer modulus, for example.

However, because the glue layer 42 is weaker relative to the etch stop layer 32, if the glue layer 42 is too thick it may make the structure weaker. On the other hand, if the glue layer 42 is too thin, it may not provide a sufficient oxygen barrier for the conductive lines 22 to prevent oxide 34 formation. Hence, the thickness of the glue layer 42 needs to be optimized, e.g., as shown in FIG. 4 (discussed above). A preferred thickness of the glue layer 42 may be less than about ⅕ that of the etch stop layer 32 for many cases, for example. The combination of these three criteria and the choice of materials for the glue layer 42 and etch stop layer 32 provide a preferred embodiment of the present invention with a greatly improved adhesion strength, as compared to the prior art (e.g., FIG. 1).

The preferred materials for the etch stop layer 32 may be SiCO, SiCN, SiC, composites thereof, layers thereof, or combinations thereof, for example. But if the etch stop layer material is changed, it is still likely that the implementation of a glue layer 32 in accordance with an embodiment of the present invention will improve the robustness and adhesion strength of the structure 40 under wire bonding processes.

Although the simplified cross-section of FIG. 2 shows two conductive lines 22 in an IMD layer 24 below an upper IMD layer 30, an embodiment of the present invention may be implemented at any IMD layer in a chip. Also, the structure and shape of the conductive lines 22 may differ from those shown in FIG. 2.

Figure 8:
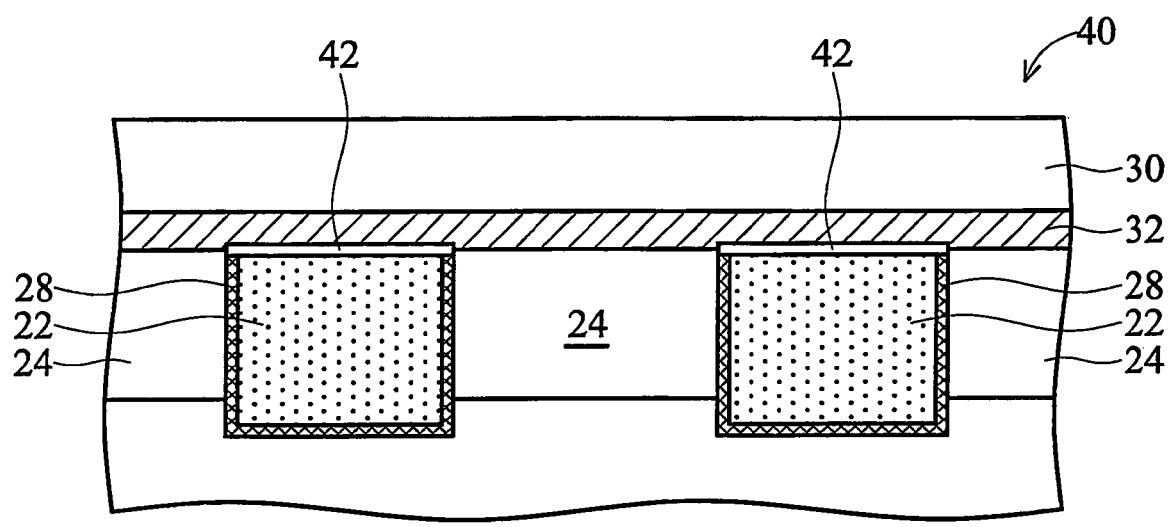
FIG. 8 is a simplified cross-section schematic showing a second illustrative embodiment of the present invention.

FIG. 8 is a simplified cross-section schematic showing a second illustrative embodiment of the present invention. The second embodiment of FIG. 8 is essentially the same as the first embodiment of FIG. 2, except that the glue layer 42 has been patterned. In some cases, it may be desirable to pattern the glue layer 42 (e.g., in alignment with the conductive lines 22) after forming it. In FIG. 8, at least part of the patterned glue layer 42 still covers the conductive lines 22 to provide the benefits discussed above with respect to the first embodiment.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit chip comprising:
   a first intermetal dielectric (IMD) layer;
   a conductive line in the first IMD layer;
   a glue layer over the conductive line, the glue layer comprising a non-oxygen-containing material comprising a mixture of Si—C and Si—CH$_2$—Si, and the glue layer having a hardness greater than that of the conductive line;
   an etch stop layer over the glue layer, the etch stop layer having a hardness greater than that of the glue layer; and
   a second intermetal dielectric (IMD) layer over the etch stop layer.

2. The chip of claim 1, wherein the conductive line comprises a conductive-line material that tends to form an oxide when exposed to an oxygen-containing substance.

3. The chip of claim 2, wherein the glue layer material is capable of providing an oxygen barrier over the conductive line.

4. The chip of claim 1, wherein the glue layer has a thickness between about 15 angstroms and about 75 angstroms.

5. The chip of claim 4, wherein the glue layer has a thickness between about 35 angstroms and about 55 angstroms.

6. The chip of claim 1, wherein the glue layer material further comprises silicon, nitrogen, and hydrogen.

7. The chip of claim 1, wherein the conductive line material comprises copper.

8. The chip of claim 1, wherein the first and second IMD layers each comprise a low-k dielectric material.

9. The chip of claim 1, wherein the etch stop layer comprises silicon.

10. The chip of claim 1, wherein the etch stop layer comprises an etch stop layer material selected from a group consisting of: a material comprising silicon, carbon, and oxygen; a material comprising silicon, carbon, and nitrogen; and a material comprising silicon and carbon.

11. The chip of claim 1, wherein at least one of the etch stop layer and the second IMD layer comprises a material comprising oxygen.

12. The chip of claim 1, wherein the glue layer material comprises Si—C bonding and Si—CH$_2$—Si bonding so that the ratio of Si—CH$_2$—Si bonding is in a range from about 0.3 to about 0.5.

13. The chip of claim 1, wherein the glue layer material comprises nitrogen or hydrogen.

14. The chip of claim 1, wherein the glue layer extends laterally beyond the boundaries of the conductive line so as to be immediately adjacent to at least a portion of the first IMD.

15. The chip of claim 1, wherein the ratio of Si—CH$_2$—Si to Si—C is in a range from about 0.3 to about 0.5.

16. An integrated circuit chip comprising:
   a first intermetal dielectric (IMD) layer;
   a conductive line in the first IMD layer;
   a glue layer over the conductive line, the glue layer comprising a non-oxygen-containing material comprising a mixture of Si—C and Si—CH$_2$—Si, the glue layer having a hardness greater than that of the conductive line, the glue layer having a thickness between about 15 angstroms and about 75 angstroms, the glue layer material comprising silicon and carbon;
   an etch stop layer over the glue layer, the etch stop layer having a hardness greater than that of the glue layer, the etch stop layer comprising silicon; and
   a second intermetal dielectric (IMD) layer over the etch stop layer, wherein at least one of the etch stop layer and the second IMD layer comprises a material comprising oxygen.

17. The chip of claim 16, wherein the conductive line comprises a conductive line material that tends to form an oxide when exposed to an oxygen-containing substance.

18. The chip of claim 17, wherein the glue layer material is capable of providing an oxygen barrier over the conductive line.

19. The chip of claim 16, wherein the conductive line material comprises copper,
   wherein the first and second IMD layers each comprise a low-k dielectric material, and
   wherein the etch stop layer comprises an etch stop layer material selected from a group consisting of: a material comprising silicon, carbon, and oxygen; a material comprising silicon, carbon, and nitrogen; and a material comprising silicon and carbon.

20. The chip of claim 16, wherein the glue layer has a thickness between about 35 angstroms and about 55 angstroms.

21. The chip of claim 16, wherein the glue layer material comprises Si—C bonding and Si—CH$_2$—Si bonding so that the ratio of Si—CH$_2$—Si to Si—C bonding is in a range from 0.3 to about 0.5.

22. The chip of claim 16, wherein the glue layer material comprises nitrogen or hydrogen.

23. The chip of claim 16, wherein the ratio of Si—CH$_2$—Si to Si—C is in a range from about 0.3 to about 0.5.

* * * * *

UNITED STATES PATENT AND TRADEMARK OFFICE
CERTIFICATE OF CORRECTION

PATENT NO. : 7,405,481 B2 Page 1 of 1
APPLICATION NO. : 11/004065
DATED : July 29, 2008
INVENTOR(S) : Lin et al.

It is certified that error appears in the above-identified patent and that said Letters Patent is hereby corrected as shown below:

On the Title Page, Item (75) Inventors, 3rd entry, delete "Cheng" and insert --Jeng--.
In the drawings, Sheet 3, Fig. 4, on the upper left corner, delete "$L_0$" and insert --$L_c$--.
In Col. 8, line 11, before bonding insert --to Si-C--.

Signed and Sealed this

Sixteenth Day of September, 2008

JON W. DUDAS
*Director of the United States Patent and Trademark Office*